(12) United States Patent
Rantala

(10) Patent No.: US 10,056,505 B2
(45) Date of Patent: Aug. 21, 2018

(54) MULTI SHELL METAL PARTICLES AND USES THEREOF

(71) Applicant: Inkron Ltd, Hong Kong (HK)

(72) Inventor: Juha Rantala, Hong Kong (HK)

(73) Assignee: Inkron Ltd, Hong Kong (HK)

( * ) Notice: Subject to any disclaimer, the term of this patent is extended or adjusted under 35 U.S.C. 154(b) by 0 days.

(21) Appl. No.: 14/217,553

(22) Filed: Mar. 18, 2014

(65) Prior Publication Data

US 2014/0264191 A1    Sep. 18, 2014

Related U.S. Application Data

(63) Continuation of application No. PCT/FI2014/050194, filed on Mar. 17, 2014.

(60) Provisional application No. 61/788,479, filed on Mar. 15, 2013.

(30) Foreign Application Priority Data

Mar. 15, 2013  (FI) ..................... 20135253

(51) Int. Cl.

| | |
|---|---|
| B22F 1/00 | (2006.01) |
| C09D 5/24 | (2006.01) |
| H01L 31/0224 | (2006.01) |
| C09D 11/52 | (2014.01) |
| C22C 9/00 | (2006.01) |
| H01B 1/02 | (2006.01) |
| C22C 9/06 | (2006.01) |
| B32B 15/01 | (2006.01) |
| B22F 1/02 | (2006.01) |
| C23C 18/16 | (2006.01) |
| C23C 18/18 | (2006.01) |
| C23C 18/36 | (2006.01) |
| C23C 18/44 | (2006.01) |
| C22C 1/04 | (2006.01) |

(52) U.S. Cl.
CPC ........ *H01L 31/022425* (2013.01); *B22F 1/02* (2013.01); *B22F 1/025* (2013.01); *B32B 15/01* (2013.01); *B32B 15/018* (2013.01); *C09D 5/24* (2013.01); *C09D 11/52* (2013.01); *C22C 9/00* (2013.01); *C22C 9/06* (2013.01); *C23C 18/1635* (2013.01); *C23C 18/1651* (2013.01); *C23C 18/1844* (2013.01); *C23C 18/36* (2013.01); *C23C 18/44* (2013.01); *H01B 1/026* (2013.01); *C22C 1/0425* (2013.01); *C22C 1/0433* (2013.01); *C23C 18/1669* (2013.01); *C23C 18/1692* (2013.01); *Y02E 10/50* (2013.01)

(58) Field of Classification Search
CPC ............. H01L 31/022425; B32B 15/01; B32B 15/018; C09D 11/52; C22C 9/00; C22C 9/06; C22C 1/0425; C22C 1/0433; B22F 1/02; B22F 1/025; H01B 1/026
USPC .................................... 252/500, 513; 427/58
See application file for complete search history.

(56) References Cited

U.S. PATENT DOCUMENTS

| | | |
|---|---|---|
| 5,840,432 A | 11/1998 | Hirai et al. |
| 6,518,667 B1 | 2/2003 | Ichida et al. |
| 2005/0227074 A1* | 10/2005 | Oyamada ................ B22F 1/025 428/403 |
| 2006/0062902 A1 | 3/2006 | Sager et al. |
| 2008/0090092 A1 | 4/2008 | Sakaue et al. |
| 2010/0096014 A1 | 4/2010 | Iida et al. |
| 2012/0077054 A1* | 3/2012 | Wu .......................... C25D 5/10 428/600 |
| 2013/0025677 A1 | 1/2013 | Miura et al. |
| 2013/0029886 A1* | 1/2013 | Mazyar .................... C09K 8/54 507/270 |

FOREIGN PATENT DOCUMENTS

| | | | |
|---|---|---|---|
| JP | 2002075057 A * | 3/2002 | |
| WO | WO 2006080289 A1 * | 8/2006 | ............ B22F 1/0059 |
| WO | WO 2006080289 A1 | 8/2006 | |
| WO | WO 2011102659 A2 | 8/2011 | |

* cited by examiner

*Primary Examiner* — Harold Pyon
*Assistant Examiner* — Danny N Kang
(74) *Attorney, Agent, or Firm* — Seppo Laine Oy

(57) ABSTRACT

A composition comprising a plurality of coated metal particles with a metal core surrounded by nested shells formed by an electrically conductive layer and by a barrier layer, at least one of the shells being formed by electroless plating. The invention also comprises a method of producing such compositions as well as the use of the composition in, for example, crystalline-silicon solar cell devices having contact structures formed on one or more surfaces of a solar cell device, such as those used in back contact solar cell devices or emitter wrap through (EWT) solar cell devices.

16 Claims, No Drawings

MULTI SHELL METAL PARTICLES AND USES THEREOF

TECHNICAL FIELD

The present invention relates to multicore metallic particles. In particular, the present invention concerns a process for preparing multicore metallic particles having an inner core of a metal, such as copper, coated with at least two layers. The present invention also relates to the application of these particles in the front contact structure of a solar cell, conductive pasteinks for electronics applications, die attach in semiconductor packaging as well as EMI coatings.

BACKGROUND ART

Conventional silicon solar cells, such as crystalline-silicon solar cells, primarily employ a silver-based metallization for the front surface current-collection grid and for the rear surface contacting areas. The silver is usually applied in paste format by screen printing. Conventional silver pastes consist of silver particles and glass frit particles mixed with an organic resin. The organic resins are required as a carrier for the printing process. The glass frit particles soften during heating especially during a firing step to hold the silver particle matrix together with the silicon substrate and to facilitate the formation of a low contact resistance metal contact on the surface of silicon solar cells Hideki Akimoto in US Patent Application Publication No. 20110223713 describes a method of producing a solar cell electrode, comprising the steps of applying on at least part of a light receiving surface of a semiconductor substrate a conductive paste comprising conductive component, glass frit and resin binder, wherein the conductive component comprises silver particles and core-shell particles in which a metal selected from the group consisting of Pd, Ir, Pt, Ru, Ti and Co is coated on the surface of silver or copper and aids during firing of the conductive paste.

In JP Patent Application No. 2006-295197, examples of electrically conductive particles include metal particles selected from the group consisting of Cu, Au, Ag, Pd, Pt and alloys of Cu, Au, Ag, Pd and Pt .The document describes the case of silicon solar cells in which the electrodes are formed on both sides; the light receiving side paste usually contains as basic components, electrically conductive particles in the form of Ag, binder, glass frit and a solvent.

U.S. Pat. No. 6,322,901 (Bawandi et al.) discloses Group II-VII and III-V semiconductor nanocrystals with core shell structures. The structures disclosed by the author featuring high luminescence efficiency were obtained by forming a semiconductor layer with a band gap greater than the core on the surface of a core nanocrystal.

Methods of synthesizing multishell metallic particles include vapor deposition processes, such as metal organic chemical vapor deposition (MOCVD), molecular beam epitaxy (MBE), evaporation, sputtering, electroplating, electroless plating, cementation and wet chemistry techniques. Electroplating and vacuum processes are not feasible for commercial purposes due to the lower efficiency of the particles.

US Patent Application Publication No. 20100062154 (Application No. 11603546) discloses a method for preparing a nanoparticle having a coreshell structure by wet chemistry technique. The method comprises (i) preparing a core nanoparticle of a powder form, (ii) dissolving a shell precursor in a solvent to form a shell precursor solution, and then allowing the shell precursor solution to be stabilized at a temperature suitable for the shell precursor to form an overcoat on the surface of a core-nanoparticle. However, such a conventional dropwise method has problems where the stability of the core in such a reaction solvent is easily affected by small changes in reaction conditions such as the temperature, solvent and concentration.

Electrically conductive fine particles and anisotropic electrically conductive materials are disclosed in WO Patent Application Publication No. 2006080289 and US Patent Application Publication Nos. 2006062902 and 2008090092.

Some non-patent literature documents (Schaadt et al., Appl. Phys. Lett. 86, 063106, 2005; Derkas et al. Appl. Phys. Lett. 89, 093113, 2006, Lim et al., J. Appl. Phys. 101, 104309, 2007; F. J. Beck, J. Appl. Phys. 105, 114310, 2009; Rand et al. J. Appl. Phys. 96, 7519, 2004) describe the use of nanoparticles not only on the front but also on the rear end of the active layer of the photo-voltaic devices with the surface plasmon enhanced scattering effect. Plasmonic Au-citrate core shell nanoparticles are synthesized chemically and deposited on the surface of wafer based silicon photo-voltaic devices. Standard sodium citrate reduction method has been used for the synthesis of these particles with core shell structure.

US Patent Specification No. 8,304, 362 B2 reports the preparation of coreshell particles as electrocatalysts for oxygen reduction, The core comprises an alloy of as precious metal, whereas the shell consists of a Pt monolayer deposited by underpotential deposition (UPD) (Ref.: J. Zhang, F. H. B. Lima etal. Journal of Physical Chemistry B Letters 2005, 109, 22701-22704.

The catalyst obtained was a Pt X C (X=Au, Ag, Pd; ML=monolayer) with the metal particles comprising an inner core consisting of metal X and a monolayer of platinum in form of a shell on top of it.

U.S. Pat. No. 7,053,021 discloses a method for the preparation of carbon-supported coreshell nanoparticles of 1-3 nm size comprising a platinum-vanadium-iron alloy.

U.S. Pat. No. 4,309,457 discloses a method for producing multilayer coated composite powder which comprises a first step of coating a starting core powder with first metallic ions and a metallic powder for reducing the first ions thereby resulting in a single layer coated powder by cementation reaction; a second step consisting of treating the single layer coated powder either with only second metallic ions other than said metallic ions or with said second ions in the presence of a metallic powder for reducing said second ions to a double layered coated powder by cementation reaction.

As these processes are completely different from current production practices, they cannot be integrated easily into current production lines.

Further art is represented by JP Patent Application Laid-Open No. S64-718 which discloses a method in which palladium is randomly attached to the surface of the copper particles and then the copper powder is put into an electroless nickel plating bath for a predetermined period of time to apply nickel coating of thickness 0.5 µm to the copper powder. This known method has drawbacks in the respect that the electroless nickel plating does not fix strongly to the surface of copper particles and unevenly coating of copper particles with the electroless plated nickel is seen.

Another patent document (JP Kokai Publication 2002-266079) discloses conductive fine particles wherein a base layer made of nickel is formed by electroless plating on the surface of base particles, which are fine particles, and a silver layer is directly formed on the surface of the base layer made of nickel using a cyanogen-free plating liquid which contains a complexing agent such as sodium sulfite or succinimide and a reducing agent such as hydrazine or sodium phosphinate.

This known method has drawbacks. It is not necessary to use copper which easily inter-diffuses with silver and therefore there is no need for the troublesome process of forming a copper layer.

SUMMARY OF INVENTION

Technical Problem

It is an object of the invention to provide methods, structures and materials for forming metal, in particular copper-containing contact structures in printing techniques, such as screen printing and ink jet printing.

It is another object of the invention to provide an improved process which has high deposition rate and efficiency.

It is a third object of the invention to provide novel uses of the novel materials e.g. in crystalline-silicon solar cell devices having contact structures formed on one or more surfaces of a solar cell device, such as those used in back contact solar cell devices or emitter wrap through (EWT) solar cell devices.

Solution to Problem

The present invention provides multi shell metal coated particles with an outer silver layer for conductive paste applications, such as on the front surface electrode of a solar cell.

In particular, the invention provides a composition comprising a plurality of coated metal particles with a metal core surrounded by nested shells formed by an electrically conductive layer and by a barrier layer.

An electroless method is used for preparing the core multishell metal particles.

Advantages of Invention

As one of the advantages of the invention it can be mentioned that it reduces silver consumption in silver coated particles as a thinner layer of silver is coated to provide higher conductivity and the underlaying barrier layer (e.g. nickel layer) eliminates copper oxidation.

Further, the method employed will give even coating of the surfaces and will help in reducing the risk of corrosion or wear of layers.

Other advantages will appear from the following discussion of embodiments.

Description of Embodiments

The present invention comprises a number of embodiments.

In a first embodiment, the metal core is formed by copper particles, in particular solid copper or copper alloy particles.

Suitably the copper particles are surrounded by a first shell of a metal forming a barrier layer, coated directly on the copper particles, and a second shell of an electrically conductive metal, forming an outer layer of the particles.

The electrically conductive metal shell forms advantageously the outermost surface of the particles.

The composition is usually provided in the form of a powder,

In one embodiment, the D90 particle size of the multi-shell copper particle is 100 microns or less. For example, the average particle size of the multi-shell copper particle is 10 microns or less.

The barrier layer thickness on the metal core particle is, in one embodiment, at least 5 nm but not more than 5 microns and the conductive layer thickness on the outermost surface is at least 5 nm but not more than 5 microns.

At least one of the layers is produced by electroless plating.

Based on the above, in one embodiment, the present compositions comprise a plurality of copper core particles as a base layer made of copper of a diameter of less than 100 μm or even less than 1 μm and a conductive barrier nickel film formed by an electroless plating process on the surface of the core particle, the outer layer formed from an electroless silver plating liquid used for producing a conductive fine particle.

As used herein, the term "coating" includes single coating, multiple coatings, and various layers that surround a core.

The materials for the coatings or layers may be chosen based on their characteristics, properties and qualities. For example, the materials may be selected for and applied as various types of barrier layers having desired barrier properties. Some of the barrier layers may include oxidation barrier layers to prevent and/or reduce oxidation of the core material, metallization barrier layers to prevent and/or reduce undesired alloying of a material with the core material, and diffusion barrier layers to prevent and/or reduce the diffusion of copper based core material into the adjacent substrate and structures thereon. Thus, the different barrier layers are applied as a coating and the coating functions as one or more types of barrier layers.

The outermost layer of an encapsulated copper-containing particle may comprise an oxidation barrier layer so that the copper metallization paste can be fired in an oxidizing ambient. The oxidation barrier layer may be any metal that forms a thin, stable oxide that dissolves in a glass frit. The oxidation barrier layer may include silver (Ag), nickel (Ni), gold (Au), platinum (Pt), palladium (Pd), zinc (Zn), their alloys or combinations thereof. The oxidation barrier layer facilitates solar cell device processing and prevents solar cell, solar module degradation in the finished product.

Thus, in a particular embodiment, the present invention provides Cu—Ni—Ag multishell metallic particle in which the copper core coated with metallization barrier layer nickel possess superior oxidation resistance which is obtained by using a nonmetallic reducing agent to strongly fix a catalyst element to the surface of copper particles.

However the present invention which involves coating of silver on the metallization barrier layer nickel uses benzaimidazole or ascorbic acid as a reducing agent and succinimide and citric acid monohydrate as complexing agents and glyoxylic acid as a crystal regulator in the electroless silver plating liquid.

Conventional front contact structures are typically formed by printing a silver paste on the front surface of the solar cell substrate. Since the cost of silver metallization paste fluctuates with the price of silver, silver tends to be an expensive precious metal which makes the silver metallization paste more expensive. One of the viable alternatives is to use silver as the conductive material for a contact structure is to use copper. Copper is a good conductor like silver, but it also has many drawbacks. Copper diffuses rapidly within silicon at typical operational temperatures for photovoltaic modules, where it is an active recombination center that can affect the solar cells efficiency. Additionally, copper oxidizes easily, which can affect its ability to make electrical contact with other current carrying features connected to the solar cell.

In one embodiments of the invention a copper metallization conductive paste may be formed using copper-containing particles that are encapsulated with one or more materials to form a coating thereon. The coatings may form a layered structure surrounding the copper containing particles, wherein the particle forms a core surrounded by one or more coatings or layers.

In one embodiment of the invention, the copper containing particle is encapsulated with a metallization barrier layer. The metallization barrier layer provides a layer that remains stable up through the firing temperatures to prevent any copper in the copper containing particle from alloying with the oxidation barrier layer. For example, if the oxidation barrier layer is silver, the eutectic point temperature of an Ag—Cu alloy is around 790° C.; which means that, as the firing temperatures rise above the Ag—Cu eutectic point, portions of the silver layer and copper from the copper-containing particle will become molten, and the copper material will form an alloy with the silver material.

The metallization barrier layer provides a stable layer between the silver based oxidation barrier layer and the copper in the copper containing particle to prevent partial alloying of copper with silver along the interface between the two materials.

The metallization barrier layer includes metal and alloys with a high liquidus point relative to copper to maintain separation between the copper-containing particle and the oxidation barrier layer.

The metallization barrier layer may include nickel (Ni), titanium (Ti), titanium nitride (TiN), tungsten (W), titanium-tungsten (Ti—W), cobalt (Co), chromium (Cr), molybdenum (Mo), their alloys, or combinations thereof. The diffusion barrier layer may be at least 5 nm thick but not more than 5 microns In some embodiments, the metallization barrier layer and diffusion barrier layer may be combined into a single layer exhibiting properties of both layers. For example, metallization barrier layer that is nickel based may also exhibit sufficient diffusion barrier properties, such that the metallization barrier layer also acts as a diffusion barrier layer. In some configurations, the copper-containing particles are individually coated with the multiple barrier layers as appropriate for the type of copper encapsulated particle.

In other embodiments, the copper containing core particle may be surrounded by at least two barrier layers, for example an oxidation barrier layer and a metallization barrier layer or a diffusion barrier layer. The oxidation barrier layer, the metallization barrier layer and the diffusion barrier layer may be formed by using electroless plating technique.

"Electroless" plating as used herein generally refers to a coating technique where it is not necessary to pass an electric current through a solution to form a deposit on a desired surface or substrate.

In one embodiment of the invention, the metal surface of the article is micro-etched and activated prior to being contacted with the working bath. For this purpose, the micro-etching is typically carried out in an oxidizing, acidic bath. In one embodiment, the micro-etching bath may include a solution of sulfuric acid, sulfuric peroxide and water.

Typically, electroless plating can be carried out as a catalytic or even auto-catalytic reaction.

The process of the present invention provides in one embodiment a way of producing multishell, nested nickel coated copper particles with an outer conducting layer of silver.

The plating catalyst comprises for example an ammoniacal ammonium sulphate solution, palladium, hydrazine, and/or acetyl acetonate as the cleaning and activating agent for the core material plating.

The plating catalyst can be fixed stably to the surface of the core material by a reduction method using a non-metallic reducing agent, for example hydrazine, formalin or sodium potassium tartrate or a combination thereof, optionally together with acetyl acetonate as an activator.

In one embodiment, the process is carried out in several steps. Thus, initially, a core particle is subjected to surface treatment so as to have a noble metal ion-capturing ability.

The next steps are, for example, as follows:
(1) catalyzation step,
(2) initial thin film formation step,
(3) electroless plating step.

In the catalyzation step 1, the core particles which have a noble metal ion capturing ability are allowed to capture noble metal ions, and then the noble metal ions are reduced so that the surfaces of the core particles support the noble metal.

In the film formation step 2, the core particles supporting the noble metal are dispersed in an initial thin film-forming solution containing nickel ions, reducing agent, and a complexing agent composed of an organic carboxylic acid or a salt thereof so that nickel ions are reduced to form initial thin nickel films on the surfaces of the core particles.

In the electroless plating step 3, a nickel ion containing solution containing the same complexing agent and a reducing agent-containing solution are individually and simultaneously added to an aqueous solution containing the core particles provided with the nickel initial thin films and the complexing agent to carry out electroless plating.

In accordance with the present invention, the first step involves producing a nickel coated copper particle comprising copper particles as the core material, in the second step a catalyst for plating is fixed to a surface of the copper particles by reduction reaction, and then, in the third step, an electroless plated nickel is applied on the catalyst.

As used herein "catalyst" refers to a substance which is capable of increasing the reaction rate or promoting only specific reaction when it is added to a system in which the reaction proceeds thermodynamically but is extremely slow actuality.

In particular, the "catalyst" as described above is required in electroless plating. It is different from electroplating in which a potential is applied to both the object to be plated and a plating metal to be electrically plated on the object to be plated. In the case of the present invention, a catalyst preferably palladium which is generally used as a catalyst is used as a catalyst element for the electroless plating.

The reducing agent-containing solution is generally an aqueous solution of a reducing agent.

The term "reducing agent" refers to a chemical substance for removing oxygen from an oxide to reduce it to be an element.

In one particularly preferred embodiment of the present invention, hydrazine is used as a reducing agent. Hydrazine is a non-metallic reducing agent represented by the chemical formula $NH_2NH_2$. In the present technology, hydrazine can be used to deposit palladium, a catalyst for copper, by reduction reaction.

In accordance with a preferred embodiment, the third step involves coating of silver on the metallization barrier layer nickel by electroless plating. The above-mentioned silver layer is formed by electroless silver plating. The method of forming a silver layer by electroless silver plating is not particularly limited as long as it is a method for forming a silver layer on the surface of above mentioned base layer made of nickel, a method using substrate-catalytic electroless silver immersion plating, for example, is appropriate for use because adhesiveness between the base layer metallization layer nickel become excellent.

Though the particle diameter of the base layer/metallization layer is not particularly limited, the preferred lower limit is 5 nm and a preferred upper limit is 5 μm.

In the method using the above mentioned substrate-catalytic electroless silver immersion plating, a reducing agent which allows an oxidation reaction to occur on the surface of the base layer/metallization layer made of nickel and does not allow an oxidation reaction to occur on the surface of silver, which is a deposited metal, is provided on the surface of the base layer, and thus silver is deposited by reducing the silver salt in the electroless silver plating liquid so that a silver plating coating film can be formed.

The electroless silver plating liquid used in the above-mentioned electroless silver plating is not particularly limited, and an electroless silver plating liquid which contains a water soluble silver salt, which is a silver ion source and a complexing agent for stably dissolving silver ions can be cited in the same manner as general electroless silver plating liquids.

The above-mentioned water soluble silver salt is not particularly limited as long as it has water solubility, and cyanogen-free silver salts such as silver nitrate and silver sulfate, and cyanogen type silver salts such as silver cyanide can be cited as examples. Among them, the cyanogen free silver salts are preferable while taking environmental issues into consideration.

Though the concentration of silver ions in the above mentioned electroless silver plating liquid is not particularly limited, a preferable lower limit is 0.005 mol/L and a preferable upper limit is 0.2 mol/L.

The above-mentioned complexing agent is not particularly limited, and compounds having an amide group such as formamide, acetoamide, oxamic acid, compounds having an imido group such as succinimide, organic acid or organic acid salts such as sulfurous acid, sulfite salts, citric acid and ammonium can be cited as examples.

The above mentioned reducing agent makes it easy for metal silver to be deposited through a reduction of silver ions in the plating liquid under the catalytic action of the base layer/metallization layer made of nickel, and is appropriately used to uniformly coat the surface of the metallization layer with a silver layer.

Though the above mentioned reducing agent is not particularly limited, imidazole compounds are preferably used. The imidazole compounds are not particularly limited and benzimidazole, imidazole-2 ethyl carboxylate, imidazole-4, 5-dicarboxylate and 1,2-dimethyl-5-niroiumidazole can be cited as examples. Among them, benzimidazole is appropriately used because of the significant selectivity in such a manner that it allows an oxidation reaction to occur on the surface of the metallization layer made of nickel and does not allow an oxidation reaction to occur on the surface of silver, which is a deposited metal. Ascorbic acid can also be used as a reducing agent for the electroless silver plating process.

Though the amount of mixture of the above mentioned reducing agent is not particularly limited, a preferable lower limit relative to silver ions is 0.07 times mol and a preferable upper limit is 0.16 times mol. Furthermore, in the case where substrate-catalytic electroless silver immersion plating is carried out, it is preferable for a crystal regulator to be contained in the electroless silver plating liquid.

The reducing agent may include formic acid as well as the salts of formic acid, i.e. metal formates, such as lithium formate, sodium formate, potassium formate, magnesium formate, calcium formate and aluminum formate. It may also be desirable to use ammonium formate as the reducing agent in one embodiment of the invention. In one embodiment of the invention, the reducing agent may have a concentration in the range from 1.0 g/L to about 5 g/L.

By including the above-mentioned crystal regulator, a substitution reaction between nickel and silver is suppressed, and the silver crystal is made to be fine so that adhesiveness between the nickel plating coating film and the silver plating coating film becomes excellent. Though the above mentioned crystal regular is not particularly limited, glyoxylic acid is preferably used. Though the amount of mixture of the above-mentioned crystal regulator is not particularly limited, a preferable lower limit relative to silver ions is 0.05 times mol and a preferable upper limit is 0.55 times mol.

As the above-mentioned electroless silver plating liquid, a liquid which contains a water soluble silver salt or the like, an imidazole compound which is a reducing agent, and a glyoxylic acid, which is used as a crystal regulator to carry out electroless silver plating on the metallization layer made of nickel, and thereby, a uniform silver layer having excellent adhesiveness can be formed without using a cyanogen compound, and furthermore a conductive layer of Ag having excellent conductivity can be obtained.

Though the pH of the above-mentioned electroless silver plating liquid is not particularly limited, a preferable lower limit is 5 and a preferable upper limit is 10. Also the temperature of the above mentioned electroless silver plating liquid is not particularly limited, a preferable lower limit is 0° C. and a preferable upper limit is 80° C. High pH 8-10 is favoured for higher Ag content in the electroless bath. Lower pH 2-4 is used for electroless baths with very low Ag content of 1 g/L.

In one embodiment, the first or second layer on the metal core is sintered in vacuum, in high boiling point solvent or in higher pressure reactor.

The electrically conductive metal layer is e.g. a metallic layer or metallic alloy with meting point below 500° C. or more preferably less than 200° C.

Summarizing the above, in accordance with an embodiment of the present technology, nested multishell Cu—Ni—Ag metallic particles can be produced in three steps. The first step involves producing a nickel coated copper particle with copper as the core material, a catalyst for plating is fixed to a surface of the copper particles by reduction reaction, and then an electroless plated nickel is applied on the catalyst. The second step involves producing an electroless silver plating liquid, into which a silver salt, a complexing agent, a reducing agent, a crystal regulator, a buffering agent and the like have been mixed in advance and where the pH and temperature have been adjusted. The third step comprises of immersing the nickel coated copper particles into the electroless silver plating liquid with the defined parameters as mentioned above.

The copper core of the particles can be a crystalline or multi-crystalline nano particle. The copper core of the particles can also be formed by or consists of hyper branched copper.

The copper core of the particles can have a smallest diameter of 1 micron or less, e.g. 5 nm up to 900 nm.

Preferably, both the barrier and the electrically conductive layers are applied by electroless plating.

Typically, the melting point of barrier coating is higher than that of the electrically conductive layer and the metal core particle.

In one alternative, the barrier layer is formed by a metal layer or a partial oxide of Ni, Zn, Ti, W, Sn, In, or Ta or an alloyed combination thereof.

In another alternative, the barrier layer is formed by $Al_2O_3$, $SiO_2$, SiN, $SiN_x$ or a combination thereof.

The electrically conductive metal layer is formed for example by Ag, Au, Pt, Pd, Sn, Zn, Pb Bi, Ni, Ti or W or an their alloyed combination thereof.

The metal core is suitably Cu or Cu alloy with Sn, Ag, Ni, Zn, or any of their alloyed combination.

In the following, non-limiting working examples are given.

EXAMPLE 1

(1) Electroless Coating of Nickel on Copper 50 g of copper powder was first etched with dilute HCl, then 25-50 mL of $PdCl_2$ (0.2-1 g L of $PdCl_2$ dissolved in 4 mL-10 ml/L of HCl). Then the solution was stirred for 15-20 mins followed by washing with DI water to obtain clean copper powder devoid of oxides. To obtain a 10 nm coating of nickel on the copper surface, 44.54 g L of $Ni^{2+}$ ion (199 g of $NiSO_4$) was used for the electroless Ni bath.

(2). Since 50 g of copper powder is equivalent 500 sq.m in surface area, the reducing agent sodium hypophosphite will be depleted in less than 5 min. The reducing agent must be replenished at pre-calculated intervals to keep the reaction going. The electroless Ni bath was composed of 44.54 g of $Ni^{2+}$, 300 g of sodium hypophosphite, 33.3 g of citric acid, 1 mL of Brij L 23 (polyoyethylene lauryl ether (0.5 g in 100 mL DI water). The pH of the bath was maintained in the range of 5.5- 6 to obtain grey colour nickel on the copper surface. The pH adjustment was made by adding sodium hydroxide (NaOH) or monoethanolamine (MEA). The experiment can also be performed with pH 9.5-10.The temperature was adjusted to 75-85° C. in a magnetic stirrer cum heater and the time of reaction was 40 min. After the completion of the reaction, the solution was filtered using vacuum filtration pump, washed with warm water several times and dried in a vacuum oven at 80° C. for 2 hours. The total volume of the solution was 1.5 L.

(2) The Second Step is the Electroless Silver Plating

For plating of 10 nm of silver layer on the nickel coated copper particle, 52.45 g of $Ag^+$ (82.3 g of AgNO3) was required. 1.5 g of benzimidazole, which is a reducing agent was first dissolved in DI water heated to 90° C.-100° C. on account of its low solubility. Silver nitrate (82.3 g) was added to the electroless Ag bath containing benzimidazole. For higher Ag content in the electroless bath the pH was maintained in the range of 8-10. Since turbidity of the solution appeared at pH 2 for higher Ag content, large amount of succinimide (600 g) and sodium hydroxide were added to maintain a clear solution and higher pH. 187 g of citric acid was employed as a complexing agent in the bath and 17 g of glyoxylic acid was added as crystal regulator, to the electroless bath. The wetting agent used was Brij L23 (polyoxyethylene lauryl ether).

(3) In the third step, the obtained nickel coated copper particles were put into the electroless silver plating bath and this solution was stirred in a magnetic stirrer. The reaction was continued for 30 min. After the completion of the reaction, the solution was filtered through Advantec Grade No.5 C Ashless Quantitative filter paper, washed with DI water several times using vacuum filtration technique. The precipitate obtained was dried in a vacuum oven for 2 hrs at 80° C., and thus the multishell Core structured Cu—Ni—Ag metallic particles were obtained. The precipitate was removed from the solution by filtration washed with deionized water and dried. Powder was greyish black and showed good conductivity by four point probe apparatus.

EXAMPLE 2

50 g of copper powder having an average particle size of 5 microns was first cleaned by immersing in a bath composed of 20 g of sodium citrate, 20 mL of concentrated hydrochloric acid and 200 ml of deionized water and stirred for 3 to 5 minutes. Copper powder was then rinsed thoroughly with de-ionized water for several times and then activated in 20 mL of $PdCl_2$ (0.2 g $PdCl_2$, 4 mL concentrated hydrochloric acid, vol made up to 1 liter) for 5 minutes followed by washing with deionized water.

The copper was then electrolessly deposited onto the nickel powder using a bath containing 1 liter of solution formulated of 30 g L nickel sulfate, 4 g of sodium citrate, 120 g of sodium hypophosphite, 5 drops of Brij L23 surfactant (0.5 g in 100 mL DI water) and 2 drops of lead (made from lead methane sulfonate) with a final pH of 4.5. The plating was carried out at 90-95° C. with agitation for 15 minutes. The samples were then subjected to drying in an oven at 50° C. for 12 hrs.

The as prepared nickel coated copper powder were subjected to electroless Ag plating in a 1000 mL bath composed of 16 g of silver nitrate, 90 gms of complexing agent succinimide, 2 drops of Brij L 23 surfactant and 1.2 g of ammonium formate. The pH of the bath was regulated to 9 by addition of 13-16 g of sodium hydroxide. The plating was carried at 65-75° C. with stirring for 15 min. After the silvering process was complete, the solids were separated, washed with DI water and 1% ascorbic acid solution, filtered and dried. The final product obtained was bright grey in colour comprising of 10 wt % nickel and 15 wt % silver. The powder was greyish black and showed good conductivity by four point probe apparatus.

EXAMPLE 3

50 g of copper powder having particle size having an average particle less than 5 microns are plated in an electroless nickel bath with the following composition: 20 g/l Nickelsulfate, 10 g/l Citric acid, and a total of 120 grams sodium hypofosfite over a period of 60 minutes during the electroless plating process at a temperature of 85 to 95 degC. The precipitate was removed from the solution by filtration, dried and optionally wasted with deionized water and dried again.

Nickel coated copper powder is plated in an electroless silver bath with the following composition: 5 to 10 gl silvernitrate, 110 g/l succinimide, and sodium hydroxide to bring the alkalinity to pH 8 to 9. The nickelplated copper powder is then immersed in the silver electrolyte over a period of 60 minutes during the electroless plating process at a temperature of 50° C. The powder was greyish black and showed good conductivity by four point probe apparatus.

EXAMPLE 4

5 g of copper powder with an average particle size of 1 microns was activated with $PdCl_2$ for 3-5 min, washed with DI water thoroughly and was then placed into the electroless Ni bath composed of 30 g/L nickel sulfate, 20-30 g of sodium hypophosphite and 1 drop of surfactant TIB LUX NPS. The total volume of the solution was 1000 mL and the regulated pH was 5.5-6. The plating time was varied from 30 minutes to 2 hrs and the plating temperature was maintained at 95-100° C.

Nickel coated copper powder is then plated in an electroless silver bath with the following composition: 5 to 10 g/l silver nitrate, 110 g/l succinimide, and sodium hydroxide to bring the alkalinity to pH 8 to 9. The nickel-plated copper powder is then immersed in the silver electrolyte over a period of 60 minutes during the electroless plating process at a temperature of 80° C. Powder was greyish and showed good conductivity by four point probe apparatus. The Copper nickel silver coated powder was greyish black and showed very good conductivity by four point probe apparatus.

EXAMPLE 5

1 gram of copper powder with an average particle size of below 500 nm was activated with $PdCl_2$ for 3 min, washed thoroughly with DI water several times and then subjected into the electroless Ni bath composed of 30 g/L nickel sulfate, 1 drop of TIB LUX NPS used as surfactant (1 mL solution diluted to 1000 mL). The pH of the bath was maintained at 4 by addition of 1 drop of nitric acid. 1 g of sodium hypophosphite was added (total amount 15 g) at regular intervals to keep the reaction going. The plating time was increased from 2-4 h and the plating temperature was 95-100° C.

Nickel coated copper nano powder is then plated in an electroless silver bath with the following composition: 5 to 10 g/l silver nitrate, 110 g/l succinimide, and sodium hydroxide to bring the alkalinity to pH 8 to 9. The nickel-plated copper powder is then immersed in the silver electrolyte over a period of 60 minutes during the electroless plating process at a temperature of 80° C. Powder was greyish black and showed good conductivity by four point probe apparatus. The Copper nickel silver coated powder was greyish and showed very good conductivity by four point probe apparatus.

It should be noted that the before the second step a sintering process may be applied for the first coating layer on the metal core particle which can be conducted in a vacuum furnace or in a high boiling point liquid solution, such as in a glycol or silicone oil but not limited to those. The sintering of the particles with a liquid or high boiling point liquid can be also conducted in a pressurized chamber at elevated temperatures with pressure. Prior to moving to the second shell layer deposition the particles with metal core and conductive barrier are washed, rinsed and dried carefully. The sintering step is can be also applied for the second step, e.g., silver plating in similar manner as for the first coating layer. Alternatively the sintering in a vacuum, in a high boiling point liquid solution or in a pressurized chamber can be conducted in simultaneously for both coating layers.

EXAMPLE 6

5 g of Inkron copper powder with an average particle size of 5 micron was activated with $PdCl_2$ for 3-5 min, washed with DI water thoroughly and was then placed into the electroless Ni bath composed of 30 g/L nickel sulfate, 20-30 g of sodium hypophosphite and 1 drop of surfactant TIB LUX NPS. The total volume of the solution was 1000 mL and the regulated pH was 5.5-6. The plating time was 2 h and the plating temperature was maintained at 95-100° C.

The Cu—Ni bimetallic powder obtained above was introduced into the electroless Sn bath composed of 17 g of tin chloride, 175 g of sodium cyanide and 21 g of sodium hydroxide and the volume made up to 1 liter with deionized water. The plating temperature of the bath was maintained at 50° C. and the plating time varied from 4 to 12 minutes. The solution was filtered, washed and dried at 50° C. for 12 h to obtain the Cu—Ni—Sn multimetallic powder. The electroless coating of the coating on the copper core of the example 1 to 6 can be replaced with metal layer or a partial oxide of Zn, Ti, W, Sn, In, Fe or Ta or an alloyed combination thereof Industrial Application According to the present invention, the above produced multi shell metallic particle can be used as a conductive paste or on the light-receiving surface electrode of a solar cell, wherein the conductive paste comprises multi shell metallic particles with copper particles forming a core with nickel as a metallization barrier layer and silver forming the final surface coat.

Alternatively, the copper particle of the paste or ink is an alloy, the barrier is a metal layer or a partial oxide of Zn, Ti, W, Sn, In or Ta or an alloyed combination thereof. The electrically conductive metal layer is formed by Ag, Au, Pt, Pd, Sn, Zn, Pb, Bi, Ni, Ti or W or an alloyed combination thereof.

According to the present invention, the above produced multi shell metallic particle can be used a as ink or paste wherein the paste or ink comprises a low melting point particles with melting point alloy less than 500° C. or more preferably less than 200° C. The low melting point alloy forms an electrically conductive bridge between the multi shell metallic particle at a lower melting point than the melting point of the ourtermost layer of the multi shell particle.

Furthermore, according to the present invention, the above produced multi metallic particles can be used as a conductive paste or ink for the pack side passivation or solder contact pad purposes of a solar cell, wherein the conductive paste comprises multi shell metallic particles, with metal core, barrier layer and conductive layer, such as copper, nickel and silver, respectively. The paste or ink further comprises at least one secondary metal particles such as aluminum, nickel, tin, vanadium, tantalum or any of their alloy, binder, solvent and optional glass frit. A typical secondary metal ratio to multi shell metallic particles is 99 w-% to 10 w %.

According to the present invention, the above produced nested multi shell metallic particles of the paste or ink can also be used as conductive adhesive, electromagnetic interference coating, electromagnetic absorber, electrode for capacitor, resistor or transistor, die attachment material, thermal interface material, wherein the conductive paste comprises multi shell metallic particles with copper particles forming a core with nickel as a metallization barrier layer and silver forming the final surface coat.

Thus, based on the above, a solar cell device may comprise front side or rear side (or combination of both) metallization conductive layers of multi-shell core particles of the kind described above and as claimed below in claims 1 to 23.

A semiconductor component may comprise electrically and/or thermally conductive die attach layer of multi-shell core particles of the kind described above and as claimed below in claims 1 to 23.

An electromagnetic interference shield may comprise composite material of multi-shell core particles of the kind described above and as claimed below in claims 1 to 23.

According to the present invention the multi-shell core articles, in particular multi-shell core particles of the kind described above and as claimed below in claims 1 to 23, can be used as anti-counterfeiting material inside paste, inks, polymers, resin, ceramic compounds and paper.

Alternative the copper particle of the paste or ink is an alloy, the barrier is metal layer or a partial oxide of Zn, Ti, W, Sn, In or Ta or an alloyed combination thereof. The electrically conductive metal layer is formed by Ag, Au, Pt, Pd, Sn, Zn, Pb Bi, Ni, Ti or W or an alloyed combination thereof. It comprises low melting point particles with melting point alloy less than 500° C. or more preferably less than 200° C. The low melting point alloy forms an electrically conductive bridge between the multi shell metallic particles at a lower melting point than the melting point of the ourtermost layer of the multi shell particle.

The barrier for any of application or compositions above is formed by $Al_2O_3$, $SiO_2$, SiN, $SiN_X$ or a combination thereof.

CITATION LIST

Patent Literature

US Patent Application Publication No. 20110223713
JP Patent Application No. 2006-295197
U.S. Pat. No. 6,322,901
US Patent Application Publication No. 20100062154
U.S. Pat. No. 8,304,362
U.S. Pat. No. 7,053,021
U.S. Pat. No. . 4,309,457
JP Patent Application Laid-Open No. S64-718
JP Kokai Publication 2002-266079
WO Patent Application Publication No. 2006080289
US Patent Application Publication No. 2006062902
US Patent Application Publication No. 2008090092

Non-Patent Literature

Schaadt et al., Appl. Phys. Lett. 86, 063106, 2005
Derkas et al. Appl. Phys. Lett. 89, 093113, 2006
Lim et al., J. Appl. Phys, 101, 104309, 2007
F. J. Beck, J. Appl. Phys, 105, 114310, 2009
Rand et al. J. Appl. Phys. 96, 7519, 2004
Zhang et al. J. Phys. Chem. B Lett.109, 22701-22704, 2005

The invention claimed is:

1. A composition comprising a plurality of coated metal particles with a metal core surrounded by nested shells formed by an electrically conductive layer and by a barrier layer, at least one of the shells being formed by electroless plating, wherein the metal core is formed by Cu or a Cu alloy with at least one of: Sn, Ag, Ni and Zn and wherein the barrier layer consists of a metal, partial oxide or an alloyed combination of: Ni, Zn, Ti, W, Sn, In or Ta and, wherein the electrically conductive metal shell forms the outermost surface of the particles and wherein:
the barrier layer thickness is at least 5 nm but not more than 5 microns and the conductive layer thickness on the outermost surface is at least 5 nm but not more than 5 microns.

2. The composition according to claim 1, wherein the copper particles are surrounded by a first shell of a metal forming a barrier layer, coated directly on the copper particles, and a second shell of an electrically conductive metal, forming an outer layer of the particles
the electrically conductive metal shell is a metallic layer or metallic alloy with a melting point below 500° C.

3. The composition according to claim 1, wherein the copper core of the particles has a largest diameter of less than 4 micron.

4. The composition according to claim 1, wherein the copper core of the particles is a crystalline or multi-crystalline nano particle, wherein the copper core has a largest diameter of less than 4 micron.

5. The composition according to claim 1, wherein the barrier and the electrically conductive layers are applied by electroless plating.

6. The composition according to claim 1, wherein the copper core of the particles is formed by or consists of hyper branched copper.

7. The composition according to claim 1, wherein the melting point of barrier coating is higher than that of the electrically conductive layer and the metal core particle.

8. The composition according to claim 1, wherein the barrier layer is formed by $Al_2O_3$, $SiO_2$, SiN, $SiN_X$ or a combination thereof.

9. The composition according to claim 1, wherein the electrically conductive metal layer is formed by Ag, Au, Pt, Pd, Sn, Zn, Pb, Bi, Ni, Ti or W or an alloyed combination thereof.

10. The composition according to claim 1, wherein the electrically conductive metal layer is formed by a conductive oxide of Ag, Au, Pt, Pd, Sn, Pb, Zn, Bi, Ni, Ti or W or an alloyed combination thereof.

11. The composition according to claim 1, further comprising a plating catalyst of an ammoniacal ammonium sulphate solution, palladium, hydrazine, and/or acetyl acetonate as a cleaning and activating agent for the core material plating.

12. The composition according to claim 1, further comprising a plating catalyst fixed stably to the surface of the core material by a reduction method using a non-metallic reducing agent, for example hydrazine, formalin or sodium potassium tartrate or a combination thereof, optionally together with acetyl acetonate as an activator.

13. The composition according to claim 1, provided in the form of a powder.

14. The composition according to claim 1, wherein D90 particle size of the multi-shell copper particle is 100 microns or less.

15. The composition according to claim 2 wherein the electrically conductive metal shell has a melting point below 200° C.

16. The composition according to claim 1, wherein the barrier layer is Ni and the conductive layer is Ag.

* * * * *